United States Patent
Kimura et al.

(10) Patent No.: US 6,407,004 B1
(45) Date of Patent: Jun. 18, 2002

(54) THIN FILM DEVICE AND METHOD FOR MANUFACTURING THIN FILM DEVICE

(75) Inventors: Tadashi Kimura, Hyogo-ken; Isao Muragishi, Osaka-fu; Hiroyoshi Sekiguchi, Osaka-fu; Masaya Sakaguchi, Osaka-fu; Hiroyasu Tsuji, Osaka-fu; Satoru Mitani, Osaka-fu, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/570,040

(22) Filed: May 12, 2000

(30) Foreign Application Priority Data

May 12, 1999 (JP) ............................. 11-130897

(51) Int. Cl.[7] ........................................... H01L 21/302
(52) U.S. Cl. ........................................ 438/720; 438/722
(58) Field of Search ................... 438/396, 369, 438/253, 3, 706, 720, 722; 257/296

(56) References Cited

U.S. PATENT DOCUMENTS

| | | | | |
|---|---|---|---|---|
| 5,847,423 A | * | 12/1998 | Yamamichi | ................. 257/296 |
| 6,071,787 A | * | 6/2000 | Joo | .............................. 438/369 |
| 6,218,258 B1 | * | 4/2001 | Joo | .............................. 438/396 |
| 6,225,133 B1 | * | 5/2001 | Yamamichi et al. | ........... 438/3 |

FOREIGN PATENT DOCUMENTS

| | | |
|---|---|---|
| JP | 5-36032 | 2/1993 |
| JP | 6-26009 | 4/1994 |

OTHER PUBLICATIONS

Summaries of the Scientific Lecture of the 22nd Meeting of the Magnetics Society of Japan (p. 79, 1998), entitled "An Electrode (Lead) Structure of Electrode–Overlapped Spin Valve Heads, and Electrode Fabrication by RIE Process" by Komura et al. (with partial translation).

* cited by examiner

*Primary Examiner*—Benjamin L. Utech
*Assistant Examiner*—Kin-Chan Chen
(74) *Attorney, Agent, or Firm*—Wenderoth, Lind & Ponack, L.L.P.

(57) ABSTRACT

As an electrically conductive layer or a lower layer of conductor layers to be patterned, a conductor layer which is dry-etchable with an oxygen-containing gas is provided. A dry etching process of the conductor layer with the oxygen-containing gas is performed highly selectively to a ground film.

7 Claims, 11 Drawing Sheets

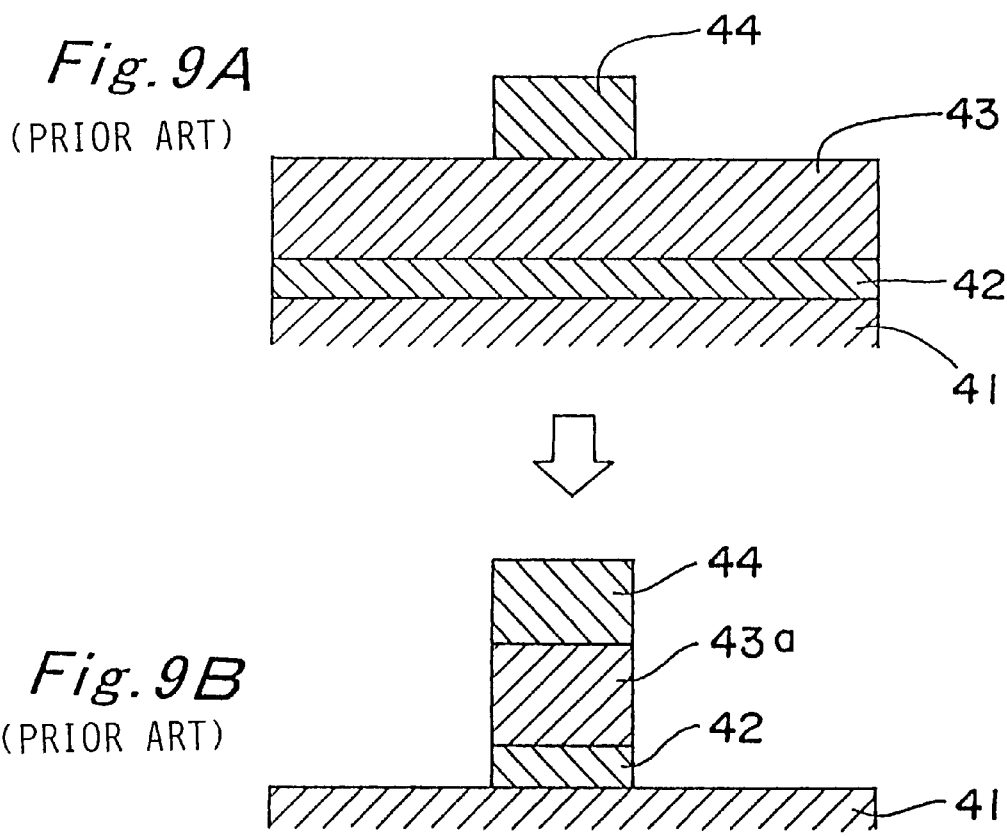

THIN FILM DEVICE AND METHOD FOR MANUFACTURING THIN FILM DEVICE

BACKGROUND OF THE INVENTION

The present invention relates to thin film devices, typified by semiconductor devices and TFTs (thin film transistors) for use in liquid crystal displays, and to a method for manufacturing the thin film devices. Also, the present invention relates to a magnetic head, as well as a method for manufacturing the magnetic head, to be used for magnetic recorders such as hard disk drives (hereinafter, referred to as HDDs), as a more concrete example of the thin film devices.

In recent years, semiconductor devices have been advancing toward higher integration, while liquid crystal displays have been advancing toward larger size. Further, thin film devices other than these devices, such as SAW devices and micromachines, have been developed into practical use.

A thin film device and a method for manufacturing a thin film device according to the prior art are described below.

In particular, the following description is centered on the pattern forming method using a dry etching process of electrical wiring for a thin film device.

FIGS. 9A and 9B show a pattern forming process of a conductor layer serving for electrical wiring using the dry etching process in conventional semiconductor devices. The method of forming a conductor layer pattern using the conventional dry etching process is described below.

In FIGS. 9A and 9B, in which FIG. 9A shows cross-sectional structure of the film before the dry etching and FIG. 9B shows that after the dry etching, reference numeral 41 denotes a Si substrate, 42 denotes a gate insulating film formed of a 4 nm thick $SiO_2$ film, 43 denotes a gate electrode made of tungsten (W) having a film thickness of 150 nm and forming a conductor layer serving as an electrical wiring, and 44 denotes an etching mask for the gate electrode 43 made of SiN. Numeral 43a denotes a gate electrode wiring formed by patterning the gate electrode 43 by dry etching.

Now the gate electrode pattern forming process using the dry etching process in conventional semiconductor devices is explained.

First, a Si substrate fabricated up to the etching mask 44 is set in a reaction chamber of a dry etching apparatus. Next, plasma of $Cl_2$ and $O_2$ mixed gas is generated, the gate electrode 43 is etched on the basis of the etching mask 44, and then the etching mask 44 is removed, by which a pattern of the gate electrode 43 is obtained.

However, in this conventional method, during the dry etching process of the gate electrode 43 made of tungsten, the etching selection ratio with $SiO_2$, which is the thin gate insulating film 42 as a ground, is as poor as around 10, and moreover the processing must be done with an enlarged over etching on account of the micro-loading effect that a difference in etching rate occurs between a micro-pattern region and thick pattern region. As a result, as shown in FIG. 9B, there occur regions where the ground $SiO_2$ gate insulating film 42 disappears so that good device characteristics could not be obtained. Also, in the future, as the gate insulating film becomes thinner and thinner with the progress toward higher integration, conventional methods would become insufficient.

Accordingly, an object of the present invention is to provide a thin film device, as well as a method for manufacturing the thin film device, which allows a conductor layer serving as an electrical wiring to be formed at high selection ratio with respect to a ground layer by using a dry etching process.

SUMMARY OF THE INVENTION

In order to achieve the above object, the present invention has the following constitutions.

According to a first aspect of the present invention, there is provided a thin film device in which a conductor layer serving as an electrical wiring in the thin film device is a conductor layer that can be dry-etched by an oxygen-containing gas.

According to a second aspect of the present invention, there is provided a thin film device in which a conductor layer serving as an electrical wiring in the thin film device is formed of two or more conductor layers, and a conductor layer on one side close to a substrate, out of the two or more conductor layers, is a conductor layer that can be dry-etched by an oxygen-containing gas.

According to a third aspect of the present invention, there is provided a thin film device according to the first aspect, wherein the conductor layer that can be dry-etched by the oxygen-containing gas is made of Ru or $RuO_2$.

According to a fourth aspect of the present invention, there is provided a thin film device according to the second aspect, wherein an upper layer of the two or more conductor layers contains any one of polysilicon, W, WN, Cu, Al, Ag, and Au.

According to a fifth aspect of the present invention, there is provided a thin film device according to the first aspect, wherein the thin film device is a semiconductor device or a TFT for liquid crystal display.

According to a sixth aspect of the present invention, there is provided a method for manufacturing a thin film device, comprising:

depositing on a substrate a conductor layer which is etchable by an oxygen-containing gas and which serves as an electrical wiring;

forming an etching mask pattern on the conductor layer; and thereafter, performing dry etching of the conductor layer with plasma of a gas containing at least oxygen to thereby accomplish a patterning of the conductor layer.

According to a seventh aspect of the present invention, there is provided a method for manufacturing a thin film device, comprising:

depositing on a substrate a lower conductor layer which is etchable by an oxygen-containing gas and which serves as an electrical wiring, and depositing one or more upper conductor layers on the lower conductor layer;

forming an etching mask pattern on the conductor layers; and thereafter, preforming dry etching of the conductor layers with plasma of a gas containing at least oxygen to thereby accomplish a patterning of the conductor layers.

According to an eighth aspect of the present invention, there is provided a method for manufacturing a thin film device according to the seventh aspect, wherein the dry etching of the upper conductor layer is performed with plasma of a halogen-containing gas.

According to a ninth aspect of the present invention, there is provided a method for manufacturing a thin film device according to the sixth aspect, wherein the conductor layer that is etchable by the oxygen-containing gas is made of Ru or $RuO_2$.

According to a 10th aspect of the present invention, there is provided a method for manufacturing a thin film device according to the seventh aspect, wherein the upper conductor layer contains any one of polysilicon, W, WN, Cu, Al, Ag, and Au.

According to an 11th aspect of the present invention, there is provided a method for manufacturing a thin film device according to the sixth aspect, wherein the thin film device is a semiconductor device or a TFT for liquid crystal display.

According to a $12^{th}$ aspect of the present invention, there is provided a thin film device as defined in the first aspect, wherein the thin film device is a magnetic head in which the conductor layer serving as the electrical wiring and being dry-etchable by the oxygen-containing gas is a non-magnetic conductor layer electrically connected to a magneto resistive element.

According to a $13^{th}$ aspect of the present invention, there is provided a thin film device as defined in the first aspect, wherein the thin film device is a magnetic head in which the conductor layer serving as the electrical wiring and being dry-etchable by the oxygen-containing gas is a conductor layer electrically connected to a magnetoresistive element and the conductor layer is made of Ru or $RuO_2$.

According to a $14^{th}$ aspect of the present invention, there is provided a thin film device according to the $13^{th}$ aspect, wherein the conductor layer is a pair of lead electrodes electrically connected to the magnetoresistive element of the magnetic head.

According to a $15_{th}$ aspect of the present invention, there is provided a thin film device according to the $13^{th}$ aspect, wherein the conductor layer is a pair of lead electrodes electrically connected to the magnetoresistive element of the magnetic head, and wherein each of the lead electrodes is comprised of two or more conductor layers and material of a conductor layer on one side in contact with the magnetoresistive element, out of the two or more conductor layers, is Ru or $RuO_2$.

According to a $16^{th}$ aspect of the present invention, there is provided a thin film device according to the $13^{th}$ aspect, wherein Ru or $RuO_2$ as a contact layer is sandwiched between the magnetoresistive element of the magnetic head and a pair of lead electrodes electrically connected to the magnetoresistive element, According to at $17^{th}$ aspect of the present invention, there is provided a thin film device comprising:
  an insulating ground layer;
  a lower shield magnetic layer formed on the insulating ground layer, a magnetoresistive element selectively formed on a first insulating layer formed on the lower shield magnetic layer;
  a permanent magnetic domain control layer formed with the magnetoresistive element interposed therein in order to give a magnetic bias to the magnetoresistive element layer;
  a pair of lead electrodes formed with a specified spacing from each other and provided to sense variations in electrical resistance of the magnetoresistive element due to external magnetic fields;
  a second insulating layer formed so as to cover the magnetoresistive element, the permanent magnetic domain control layer, and the pair of lead electrodes; and
  an upper shield magnetic layer formed on the second insulating layer, wherein
  Ru or $RuO_2$ is used as the pair of lead electrodes connected to the magnetoresistive element, or as a contact layer of the lead electrodes.

According to an $18^{th}$ aspect of the present invention, there is provided a thin film device according to the $17^{th}$ aspect, wherein the first insulating layer is a lower gap layer and the second insulating layer is an upper gap layer.

According to a $19^{th}$ aspect of the present invention, there is provided a method for manufacturing a thin film device including a process for patterning a pair of lead electrodes on a magnetoresistive element portion and on a permanent magnetic domain control layer formed at both end portions of the magnetoresistive element in a direction of track width on a lower shield layer and a first gap film both formed on a substrate, with the lead electrodes to be electrically connected in series to the magnetoresistive element, wherein the process of patterning the lead electrodes comprises:
  depositing a film of Ru or $RuO_2$ serving as the lead electrodes;
  forming an etching mask pattern on the lead electrodes; and
  thereafter performing a dry etching process of Ru with plasma of a gas containing at least oxygen.

According to a 20th aspect of the present invention, there is provided a method for manufacturing a thin film device according to the 19th aspect, further comprising:
  forming the etching mask pattern by depositing a film of $SiO_2$ or SiN;
  thereafter forming a resist pattern on the etching mask pattern by photolithography; and
  thereafter forming the $SiO_2$ film or SiN film by dry etching.

According to a 21st aspect of the present invention, there is provided a method for manufacturing a thin film device according to the 20th aspect, wherein the $SiO_2$ film or SiN film of the etching mask is used as part of an insulating film on the lead electrodes.

According to a 22nd aspect of the present invention, there is provided a method for manufacturing a thin film device including a process for patterning a pair of lead electrodes on a magnetoresistive element portion and on a permanent magnetic domain control layer formed at both end portions ofthe magnetoresistive element in a direction of track width on a lower shield layer and a first gap film both formed on a substrate, with the lead electrodes to be electrically connected in series to the magnetoresistive element, wherein the process of patterning the lead electrodes comprises:
  forming the lead electrodes from two or more conductor layers, a material of the conductor layers in contact with the magnetoresistive element being Ru or $RuO_2$;
  forming an etching mask pattern on the conductor layers;
  thereafter performing a dry etching process of the lead electrode upper layer other than the Ru or $RuO_2$ layer with plasma of a gas containing halogen; and
  thereafter performing a dry etching process of the Ru or $RuO_2$ layer with plasma of a gas containing at least oxygen.

According to a 23rd aspect of the present invention, there is provided a method for manufacturing a thin film device including a process for pat terning a pair of lead electrodes on a magnetoresistive element portion and on a permanent magnetic domain control layer formed at both end portions of the magnetoresistive element in a direction of track width on a lower shield layer and a first gap film both formed on a substrate, with the lead electrodes to be electrically connected in series to the magnetoresistive element, wherein the process of patterning the lead electrodes comprises:
  forming a Ru layer on one side of the magnetoresistive element closer to the lead electrodes;
  performing a patterning of the magnetoresistive element and a patterning of the permanent magnetic domain control layer on both end portions of the magnetoresistive element in the track width direction;

thereafter depositing a film of the lead electrodes and forming an etching mask on the film of the lead electrodes by photolithography;

thereafter performing a dry etching process of the film of the lead electrodes with plasma of a halogen-containing gas; and thereafter performing a dry etching process of the Ru layer with plasma of a gas containing at least oxygen.

According to a 24th aspect of the present invention, there is provided a method for manufacturing a thin film device including a process for patterning a pair of lead electrodes onto a magnetoresistive element portion and on a permanent magnetic domain control layer formed at both end portions of the magnetoresistive element in a direction of track width on a lower shield layer formed on a substrate, with the lead electrodes to be electrically connected in series to the magnetoresistive element, wherein the process of patterning the lead electrodes comprises:

forming a $RuO_2$ layer on one side of the magnetoresistive element to be closer to the lead electrodes;

performing a patterning of the magnetoresistive element and a patterning of the permanent magnetic domain control layer on both end portions of the magnetoresistive element in the track width direction;

thereafter depositing a film of the lead electrodes and forming an etching mask on the film of the lead electrodes by photolithography;

thereafter performing a dry etching process of the film of the lead electrodes with plasma of a halogen-containing gas; and thereafter performing a dry etching process of the $RuO_2$ layer with plasma of a gas containing at least oxygen.

According to a 25th aspect of the present invention, there is provided a thin film device according to the 16th aspect, wherein a material of the lead electrodes other than the Ru or $RuO_2$ is a non-magnetic metal such as W, Ta, Rh, Cr, Al, or Ir, or an alloy containing any of these elements.

According to a 26th aspect of the present invention, there is provided a method for manufacturing a thin film device according to the 14th aspect, wherein a material of the lead electrodes other than the Ru or $RuO_2$ is a non-magnetic metal such as W, Ta, Rh, Cr, Al, or Ir, or an alloy containing any of these elements.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 9A and 9B are views showing part of cross-sectional structure of a semiconductor device according to the prior art;

DETAILED DESCRIPTION OF THE PREFERRED EMBODIMENTS

Figure 1A:
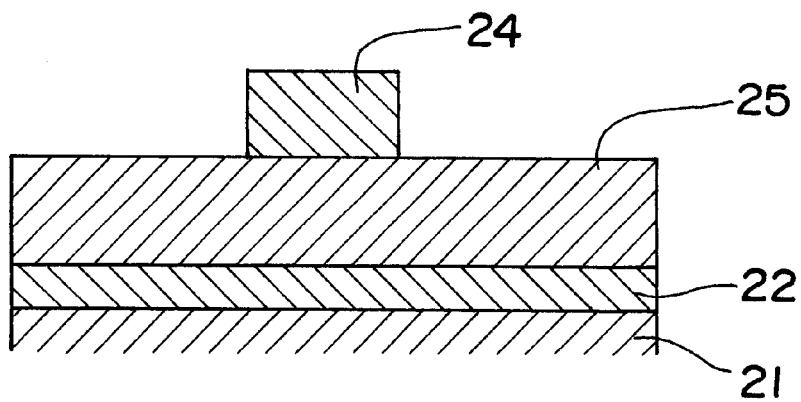
FIGS. 1A and 1B are views showing part of film structure of a gate electrode of a semiconductor device before and after dry etching, respectively, according to a first embodiment of the present invention.

Before the description of the present invention proceeds, it is to be noted that like parts are designated by like reference numerals throughout the accompanying drawings.

Hereinbelow, embodiments of the present invention are described with reference to the accompanying drawings.

First Embodiment

A thin film device and a method for manufacturing the thin film device according to a first embodiment of the present invention are described below concretely with reference to FIGS. 1A and 1B. The following description is directed to a semiconductor device as an example of the thin film device.

Figure 1B:
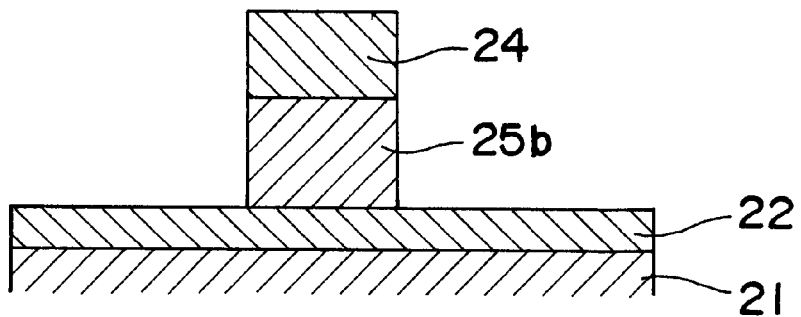

Referring to FIG. 1A and FIG. 1B, in which FIG. 1A shows film cross-sectional structure of a gate electrode before dry etching and FIG. 1B shows film cross-sectional structure of the gate electrode after the dry etching, reference numeral 21 denotes a Si substrate, 22 denotes a gate insulating film formed on the Si substrate 21 and formed of a 4 nm thick $SiO_2$ film, and 24 denotes an etching mask on a conductor layer on the gate insulating film 22 and formed of SiN and used for forming gate electrode wiring 25b, where the Si substrate 21, gate insulating film 22 and etching mask 24 are made from the same materials as in the prior art. A difference from the prior art is that a gate electrode 25 on the gate insulating film 22 as the conductor layer serving as an electrical wiring is formed of ruthenium (Ru) having a film thickness of 150 nm. Numeral 25b denotes gate electrode wiring formed from the gate electrode 25 patterned by dry etching of the gate electrode 25.

With respect to the thin film device and the method manufacturing the thin film device constituted as described above, the manufacturing method is explained with reference to FIG. 1A and FIG. 1B. It is noted that conditions shown below are given by way of an example.

First, a substrate for a semiconductor device is prepared, as shown in FIG. 1A, in which the gate insulating film 22 of $SiO_2$ is formed on the Si substrate 21, the gate electrode 25 of ruthenium is formed on the gate insulating film 22, and further the etching mask 24 of SiN having a specified pattern is formed on the gate electrode 25.

Next, the semiconductor device substrate is loaded into a vacuum reaction chamber of an inductively-coupled-plasma (ICP) dry etching system which is capable of generating high-density plasma and executing microfabrication.

Next, $O_2$ gas is introduced into this reaction chamber at 100 cc/min., the pressure of the reaction chamber is adjusted to 1 Pa, and then RF powers of 800 W and 100 W are supplied to the ICP plasma source and the substrate stage having the semiconductor device substrate placed thereon, respectively, so that $O_2$ plasma is generated, by which Ru, which is the gate electrode 25, is dry-etched. Ru forms $RuO_4$ in oxygen plasma, and this $RuO_4$ becomes gaseous, and is exhausted, in a vacuum because of its extremely low boiling point of 40° C. at atmospheric pressure, as compared with other metals, thus accelerating the etching process. Generally, a metallic oxide has a very high boiling point as much as 1000° C. or more at atmospheric pressure and therefore is hardly etched in oxygen plasma, whereas Ru, which is the gate electrode 25, can be etched by $O_2$ plasma. Under these etching conditions, the etching rate of ruthenium film as the gate electrode 25 is 43 nm/min. In this case, the $SiO_2$ film of the gate insulating film 22, which is the ground layer, is hardly etched in oxygen plasma, and ruthenium, which is the gate electrode 25, can be etched highly selectively.

As shown above, according to the first embodiment, in the process of forming a micro-pattern of the gate electrode 25, since the gate electrode 25 as a conductor layer serving as an electrical wiring is formed of ruthenium (Ru), ruthenium of the gate electrode 25 can be formed at a high selection ratio without etching the thin-film $SiO_2$, which is the gate insulating film 22 under the gate electrode 25. Thus, a thin film device exhibiting good characteristics, quality and yield can be obtained.

Second Embodiment

A thin film device and a method for manufacturing the thin film device according to a second embodiment of the present invention are described below concretely with reference to FIGS. 2A, 2B, and 2C. The following description is directed to a semiconductor device as an example of the thin film device.

The second embodiment differs from the first embodiment in that the gate electrode as the conductor layer wiring is formed of two or more layers. 10 nm thick ruthenium (Ru) is used as the electrically conductive material of the lower layer-side conductor layer 25a, and 150 nm thick tungsten (W) is used as the electrically conductive material of the upper layer-side conductor layer 23. The rest of constitutions and materials are the same as in the first embodiment. Use of tungsten, which is an example of materials even lower in resistance than Ru of the lower layer-side conductor layer 25a, as the material of the upper layer-side conductor layer 23 is intended to reduce the wiring resistance so that higher speed operation and lower power consumption of the device can be achieved.

With respect to the thin film device and the method for manufacturing the thin film device constituted as described above, the manufacturing method is explained with reference to FIGS. 2A, 2B, and 2C. It is noted that conditions shown below are given by way of example.

The second embodiment is characterized in that the upper layer-side conductor layer 23 of tungsten and the lower layer-side conductor layer 25a of ruthenium, which constitute the two-layered gate electrode, are dry-etched in two steps. FIG. 2A shows a cross section ofthe film structure before the etching of the two-layered gate electrode, FIG. 2B shows after etching of the upper layer-side conductor layer 23 out of the two-layered gate electrode, and FIG. 2C shows a cross-sectional structure after the etching of the lower layer-side conductor layer 25a as a lead electrode out of the two-layered gate elector.

Figure 2A:
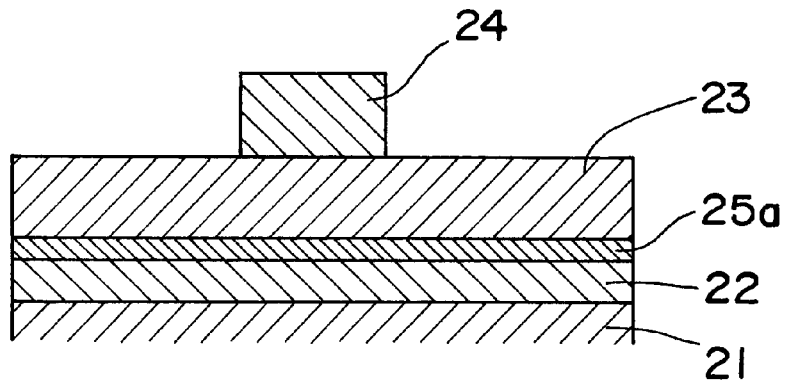
FIGS. 2A, 2B, and 2C are views showing part of film structure of a conductor layer on upper layer- and lower layer-sides in a semiconductor device according to a second embodiment of the present invention, before etching, after the etching of the upper layer-side conductor layer, and after the etching of the lower layer-side conductor layer, respectively.
Figure 2B:
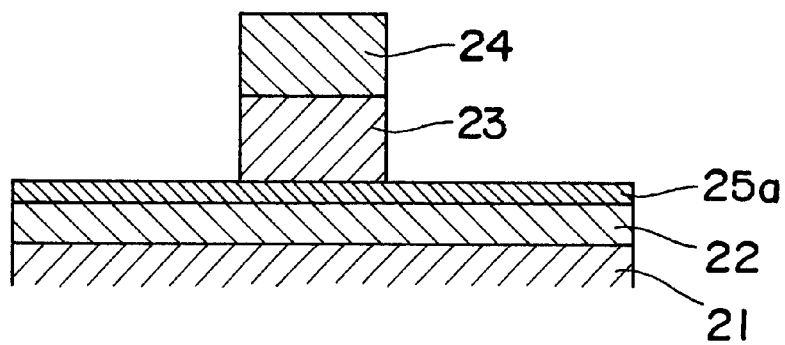
Figure 2C:
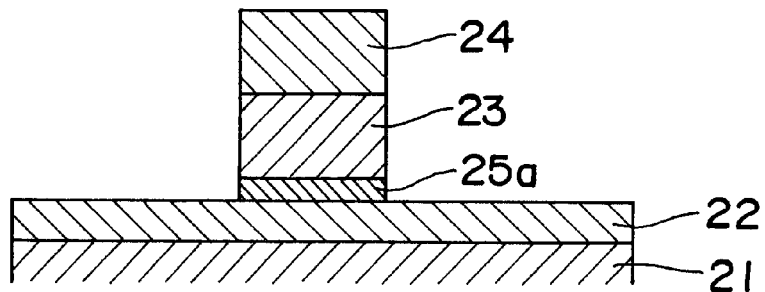

First, a substrate for a semiconductor device is prepared, as shown in FIG. 2A, in which the gate insulating film 22 of $SiO_2$ is formed on the Si substrate 21, the lower layer-side conductor layer 25a of ruthenium is formed on the gate insulating film 22, the upper layer-side conductor layer 23 of tungsten is formed on the lower layer-side conductor layer 25a, and further the etching mask 24 of SiN having a specified pattern is formed on the upper layer-side conductor layer 23.

Next, the semiconductor device substrate is loaded into a vacuum reaction chamber of an inductively-coupled-plasma (ICP) dry etching system.

Next, as a first-step etching, $SF_6$ gas and $Cl_2$ gas in a ratio of 1:1 are introduced into this reaction chamber at 50 cc/min., the pressure of the reaction chamber is adjusted to 0.5 Pa, and then RF powers of 300 W and 30 W are supplied to the ICP plasma source and the substrate stage having the semiconductor device substrate placed thereon, respectively, so that plasma is generated, by which the upper layer-side conductor layer 23 of tungsten is dry-etched. In this process, the etching rate of tungsten of the-upper-layer-side conductor layer 23 is 120 nm/min., and the selection ratio of the ruthenium of the lower layer-side conductor layer 25a to tungsten of the upper layer-side conductor layer 23 is 52. As a result, the upper layer-side conductor layer 23 of tungsten can be etched with substantially no of cutting the lower layer-side conductor layer 25a of ruthenium.

Next as a second-step etching, $O_2$ gas is introduced into this reaction chamber at 100 cc/min, the pressure of the reaction chamber is adjusted to 1 Pa, and then RF powers of 800 W and 100 W are supplied to the ICP plasma source and the substrate stage, respectively, so that oxygen plasma is generated, by which the ruthenium film of the lower layer-side conductor layer 25a is etched. In this process, the etching rate of ruthenium film, which is the lower layer-side conductor layer 25a, is 43 nm/min, where the $SiO_2$ film of the ground gate insulating film 22 is hardly etched in oxygen plasma, and ruthenium, which is the lower layer-side conductor layer 25a, can be etched highly selectively.

As shown above, according to the second embodiment, in the process of forming micropatterns of the upper layer-side conductor layer 23 and the lower layer-side conductor layer 25a, which are a two-layer gate electrode, the upper layer-side conductor layer 23 and ruthenium of the lower layer-side conductor layer 25a can be formed at a high selection ratio without etching the thin-film $SiO_2$, which is the gate insulating film 22. Thus, a thin film device exhibiting good characteristics, quality, and yield can be obtained. Also, use of tungsten, which is an example of a material even lower in resistance than ruthenium of the lower layer-side conductor layer 25a, as the material of the upper layer-side conductor layer 23, makes it possible to reduce the wiring resistance, so that higher operating speed and lower power consumption of the device can be achieved.

In this second embodiment, with the gate electrode formed in two layers, given a thickness $t_1$ of the upper layer-side conductor layer 23, an overetching percentage x at the upper layer-side conductor layer 23, a Ru thickness $t_{Ru}$ of the lower layer-side conductor layer 25a, a RU selection ratio S of the lower layer-side conductor layer 25a, a Ru cut thickness $\Delta t_{Ru}$ of the lower layer-side conductor layer 25a in the overetching at the upper layer-side conductor layer 23, and a safety factor Z, it is preferable that $\{t_1 \times [(100+x)/100] - t_1\}/S = \Delta t_{Ru}$ and that $t_{Ru} = Z \times \Delta t_{Ru}$. However, the percentage x of the overetching at the upper layer-side conductor. layer 23 depends on the thin film device. For example, whereas a percentage of x=10–20% will be sufficient for a flat thin film device, the percentage is preferably larger than x=20% for a thin film device having a step. Also, the safety factor Z is preferably not less than 2 in view ofthe uniformity of film thickness and the like. The selection ratio S of Ru of the lower layer-side conductor layer 25a, depending on the material ofthe upper layer-side conductor layer 23 and the etching conditions, is preferably not less than 2 for reliable exertion of the above selection ratio of Ru.

It is noted that the present invention is not limited to the above embodiments and may be carried out in other various ways.

For example, in the first and second embodiments, ruthenium is used as the material of the gate electrode 25 which is a conductor layer serving as an electrical wiring, and as the material of the lower layer-side conductor layer 25a out of the two or more conductor layers. However, $RuO_2$ is also etchable by oxygen plasma and therefore similar effects can be obtained even by using $RuO_2$ instead of ruthenium.

Figure 11A:
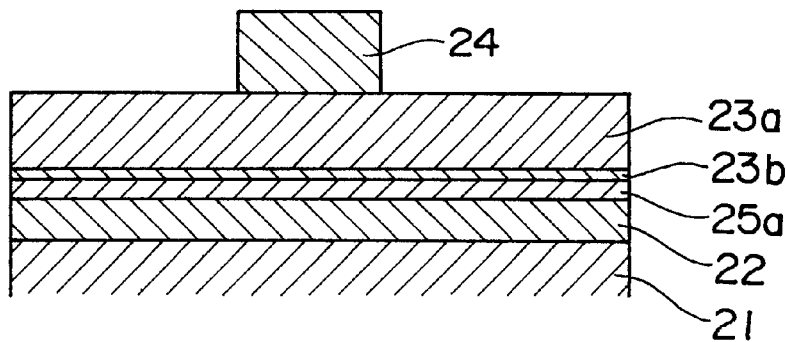
FIGS. 11A, 11B, and 11C are views showing part of film structure of the conductor layer in a semiconductor device which is a modification example according to the second embodiment of the present invention, before etching of the upper layer-side and the lower layer-side conductor layer, after the etching of the upper layer-side conductor layer, and after the etching of the lower layer-side conductor layer, respectively.
Figure 11B:
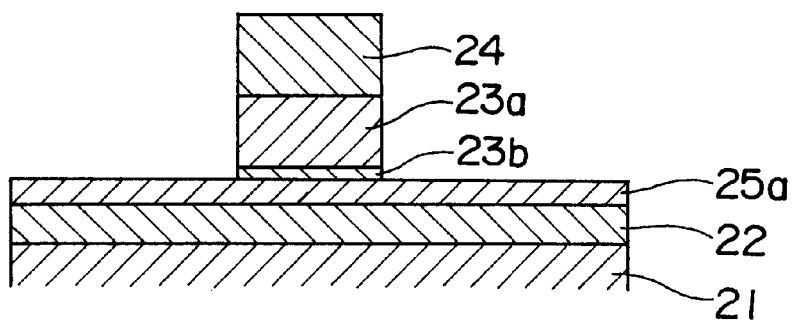
Figure 11C:
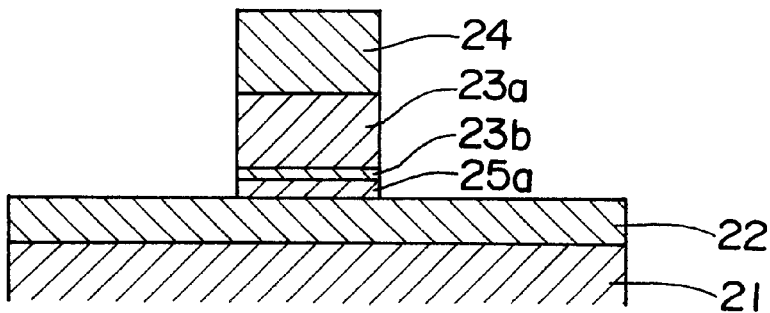

Also, in the second embodiment, tungsten is used as the material of the gate electrode as the upper layer-side conductor layer 23. However, as shown in FIGS. 11A, 11B, and 1C, the upper layer-side conductor layer 23 may also be composed of an upper layer-side first conductor layer 23a of tungsten (W) and a second conductor layer 23b of tungsten nitride (wolfram nitride, WN) under the upper layer-side first conductor layer 23a. In this case, as an example, the thickness of tungsten (W) is 150 nm and the thickness of the tungsten nitride (wolfram nitride, WN) is 10 nm. It is noted that FIGS. 11A, 11B, and 11C are views corresponding to FIGS. 2A, 2B, and 2C, respectively, where the difference between the two groups of FIGS. 2A, 2B, 2C and FIGS. 11A, 11B, 11C in terms of steps is only that whereas the upper layer-side conductor layer 23 of tungsten is etched, the upper layer-side first conductor layer 23a of tungsten (W) and the upper layer-side second conductor layer 23b of tungsten nitride are concurrently etched.

Also in the second embodiment, as the material of the gate electrode as the upper layer-side conductor layer 23, W may be replaced with a metal such as Al, Cu, and Ag;

an alloy containing these elements; or a layer of their laminations (each of which has a lower resistance value than ruthenium).

Also in the second embodiment, $SF_6$ and $Cl_2$ are used as the gas for dry etching of the gate electrode, which is the upper layer-side conductor layer 23. However, $CF_4$ or $CHF_3$, $Cl_2$, HBr, or other gas containing halogen element may alternatively be used.

Also, the first and second embodiments have been described with gate electrode wiring of a semiconductor device. However, without being limited to this, the present invention may be applied to the formation of wiring patterns for semiconductor devices that require a ground layer and a highly selective etching, or the formation of wiring patterns for liquid crystal displays.

Furthermore, as examples of the thin film device, below described are cases where the present invention is applied to magnetoresistive elements for magnetic heads, which are used for magnetic recording media such as hard disk drives (HDDs), as third through sixth embodiments ofthe present invention.

Third Embodiment

A magnetic head and a method for manufacturing the magnetic head as an example of a thin film device and a method for manufacturing the thin film device according to a third embodiment of the present invention are concretely described with reference to FIGS. 3A, 3B, 3C, 3D, and 3E. Before the concrete description of the third embodiment begins, some issues unique to magnetic heads and methods for manufacturing magnetic heads according to the prior art are first described.

In recent years, recording density of HDDs has been increasing year by year with the advances toward smaller size of hardware and larger capacity of storage. Besides, their transfer rate is also in progress toward higher rates. In order to achieve higher-density recording, energetic efforts have been exerted for development of higher-sensitivity techniques using thin-filmed Magnet Resistance elements (hereinafter, referred to as MRs) or spin-valve type giant magnet Resistance elements (GMRs), as well as for development of narrower tracks using microfabrication technologies of recording and regenerative track width.

A magnetic head and a method for manufacturing the magnetic head according to the prior art are described below.

As examples of the magnetic head and the method for manufacturing the magnetic head according to the prior art, Japanese Patent Publication 6-26009 and Japanese Laid-Open Patent Publication 5-36032 disclose methods for manufacturing a lead electrode pattern for a magnetoresistive element (MR or GMR) with an aim of reading narrower tracks. Also, manufacture of a lead electrode pattern using a dry etching process is reported as "An Electrode Structure of Electrode-Overlapped Spin Valve Heads, and Electrode Fabrication by RIE Process" in the Summaries of the Scientific lecture of the 22nd Meeting of the Magnetics Society of Japan (p. 79, 1998). This report discloses that the formation of micro regenerative tracks is enabled by forming a pair of lead electrodes with a narrow spacing therebetween on a GMR for the purpose of detecting resistance variations of the GMR due to external magnetic fields.

FIGS. 10A, 10B, 10C, and 10D show the manufacturing process of a lead electrode pattern according to the prior art. This process is explained below.

Referring to FIGS. 10A, 10B, 10C, and 10D, reference numeral 61 denotes a lower shield layer of NiFe film deposited and patterned on an $Al_2O_3TiC$ substrate (not shown) with $Al_2O_3$ film added, and 61a denotes alumina serving as a lower gap film. Numeral 62 denotes a spin-valve type GMR deposited on the lower gap film 61a and patterned by ion milling. The GMR 62 is formed of a multilayee structure of thin films of the nm order, comprising a total of six layers of, from the bottom, a 3 nm NiFe layer, a 1 nm Co layer, a 2 nm Cu layer, a 2 nm CoFe layer, an antiferromagnetic film, and a CrPtMn or Cr layer as an etching stopper.

Numeral 63 denotes a permanent magnetic domain control layer for the GMR layer 62. Numeral 70 denotes a pair of lead electrodes which are electrically connected in series to the magnetoresistive element and which are made of Ta or TaW having a film thickness of 100 nm. Numeral 65 denotes a resist mask serving as an etching mask for the lead electrodes 70 and formed by a photolithography process.

Figure 10A:
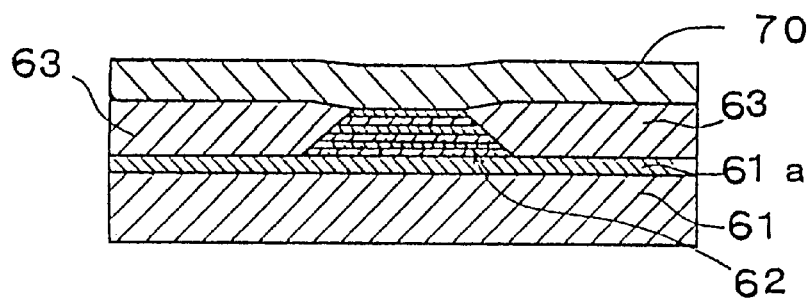
FIGS. 10A, 10B, 10C, and 10D are views showing part of a magnetic head in a process of forming a lead electrode pattern according to the prior art.
Figure 10B:
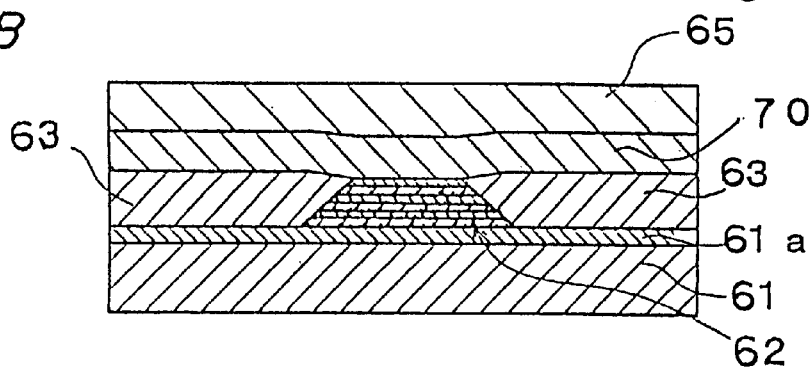
Figure 10C:
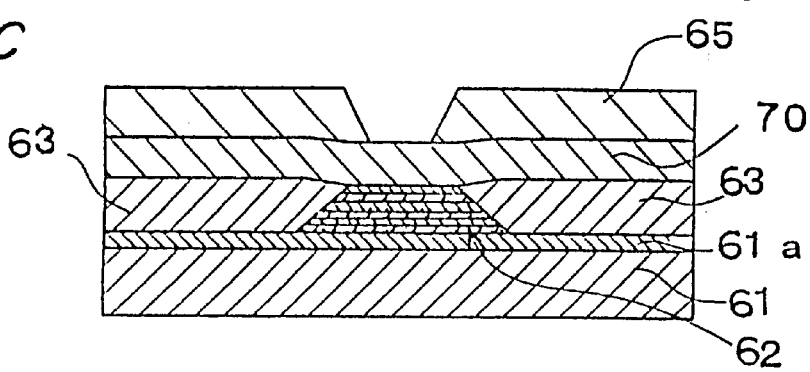

First, as shown in FIG. 10A, the lead electrodes 70 are formed both on the GMR 62 and the permanent magnetic domain control layer 63 formed so as to surround the GMR 62. Then, as shown in FIG. 10B, the resist 65 is formed on the lead electrodes 70 all over the substrate by a spin coating process. Then, as shown in FIG. 10C, the resist mask 65 is formed into a specified pattern by a photolithography process. Then, as shown in FIG. 10D, the lead electrodes 70 are dry-etched on the basis of the resist mask 65.

Figure 10D:
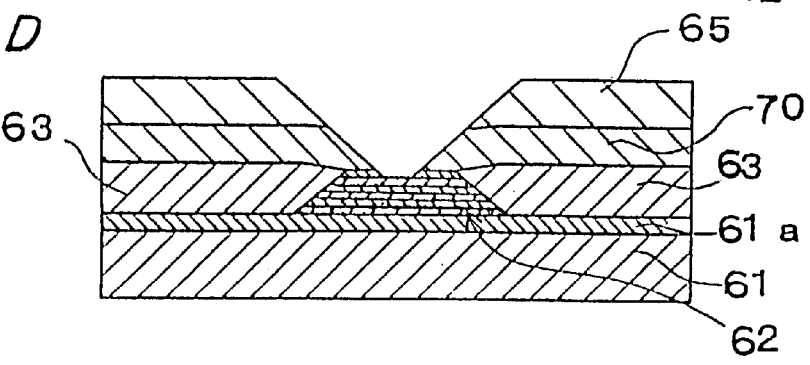

Now the process of manufacturing the pattern in the lead electrodes 70 using a dry etching process in the conventional manufacture of the magnetic head shown in FIG. 10D is described.

First, a substrate fabricated up to the resist mask 65 for the lead electrodes 70 (FIG. 10C) is set in a reaction chamber of a dry etching system.

Next, plasma of $SF_6$ gas is generated, the lead electrodes 70 are etched on the basis of the resist mask 65, and then the resist mask 65 is removed, by which a pattern of the lead electrodes 70 is obtained. The distance between a pair of lead electrodes 70 becomes the width of the regenerative track.

In this conventional method, a dry etching process of electrode material is carried out by using a gas containing halogen such as fluorine (F)-based gases ($CF_4$, $CHF_3$, $SF_6$, $F_2$, etc.), chlorine (Cl)-based gases ($Cl_2$, HCl, $BCl_3$, $ClF_3$, $CCl_4$, etc.), bromine (Br)-based gases (HBr, $Br_2$), and iodine (I)-based gases (HI etc.). However, there is an issue that because of insufficient selection ratio, which is a ratio of etching rate between the lead electrodes 70 and the surface layer of the ultra thin GMR layer 63, even the surface-layer material of the ultrathin GMR 63 would be etched, causing the GMR characteristics to deteriorate. In particular, in recent years, there have been reported many cases where ultrathin (5–10 nm) Ta is used as a cap layer for the GMR 63. In such a case, because Ta would also be easily etched by the halogen plasma, the cap-layer Ta would not remain after the etching and, besides, the surface layer of the GMR 63 would undergo plasma impact. Therefore, in this prior art example, as an etching stopper, a protection layer of Cr or CrPtMn is used for the surface layer. In this case, however, there is an issue that because of the electrical conductivity of the stopper layer, the GMR 63 would be subject to decreases in resistance value as well as occurrence of diversion flows, causing the sensitivity to resistance variations of the GMR 63 to lower. Japanese Laid-Open Patent Publication 5-36032, which is the other prior art example, discloses a manufacturing method in which a second conductor layer (Cr, V, Fe, Co, Ni, Cu, Pd, Ag, Pt, Au, and their alloys) having resistance to dry etching of fluorocarbon-based gases is provided at a lower layer. This method, however, also has a similar problem of causing the sensitivity to lower. Further in Japanese Patent Publication 6-26009, an example is shown in which a second conductor layer of a material having resistance to $O_2$-added Ar gas is provided at a lower layer, and this second conductor layer is subjected to wet etching with a mixed aqueous solution of $K_3Fe(CN)_6$ and KOH, or dry etching with $CF_4$ plasma. However, in the case of wet etching, which is isotropic etching, dimensional precision could not be obtained; in the case of dry etching with $CF_4$ plasma, the surface of the ground magnetoresistive layer would be etched and, moreover, fluorinated and thereby surface-altered. Thus, there is an issue that good sensitivity characteristics could not be obtained.

In order to solve these and other issues, for the magnetic head and the method for manufacturing the magnetic head, there are requirements in terms of material, structure, and dry etching method for the magnetic head that enable a dry etching process of lead electrodes having a high selection ratio to be implemented without etching the GMR surface layer.

An object of the magnetic head and the method for manufacturing the magnetic head according to the third embodiment of the present invention is to allow the lead electrodes to be patterned by a highly selective dry etching process without damaging (etching) a GMR.

In the magnetic head and the method for manufacturing the magnetic head according to the third embodiment of the present invention, Ru or $RuO_2$ is used as an electrically conductive layer to be electrically connected to the read-use magnetoresistive element of the magnetic head, and the Ru or $RuO_2$ is dry-etched with plasma containing oxygen.

This is explained below in more detail with reference to FIGS. 3A, 3B, 3C, 3D, and 3E.

Figure 8:
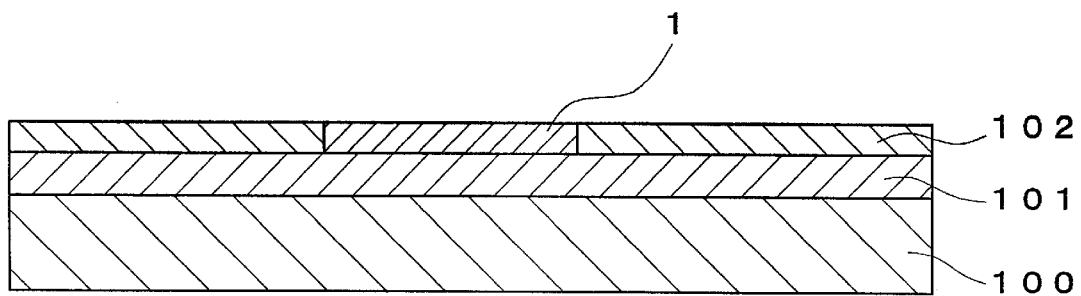
FIG. 8 is a cross-sectional view of an altic substrate with a lower shield selectively formed, for use in manufacturing the magnetic heads according to the third to sixth embodiments.

Referring to FIGS. 3A, 3B, 3C, 3D, and 3E, reference numeral 1 denotes a lower shield layer of NiFe film deposited and patterned on an $Al_2O_3TiC$ substrate with $Al_2O_3$ film added, the structure of the lower shield layer 1 being shown in FIG. 8. Referring to FIG. 8, numeral 100 denotes the $Al_2O_3TiC$ substrate, and 101 and 102 denote the $Al_2O_3$ film. FIG. 8 is a process diagram before the lower shield layer of FIG. 3 is formed. Referring to FIGS. 3A, 3B, 3C, 3D, and 3E, 1a denotes alumina film serving as a lower gap film deposited on the lower shield 1. Numeral 2 denotes a spin-valve type GMR deposited on the lower gap film 1a to form a magnetoresistive element and patterned by ion milling. The GMR 2 is formed of a multilayer structure of thin films of the nm order, comprising a total of six layers of, from the bottom, a 3 nm NiFe layer, a 1 nm Co layer, a 2 nm Cu layer, a 2 nm CoFe layer, a 25 nm PtMn antiferromagnetic film, and a 5 nm Ta cap layer, as one example. Numeral 3 denotes a permanent magnetic domain control layer for the GMR layer 2, formed of CoPt and patterned by a lift-off process. Numeral 4 denotes a pair of lead electrodes which are electrically connected in series to the GMR 2 of the magnetoresistive element and which are made of ruthenium (Ru), the film thickness being 100 nm. Numeral 5 denotes a resist mask (with a film thickness of 3 μm) serving as an etching mask for the lead electrodes 4 and formed by a photolithography process.

The manufacturing method for the magnetic head constituted as described above is explained with reference to FIGS. 3A, 3B, 3C, 3D, and 3E.

Figure 3A:
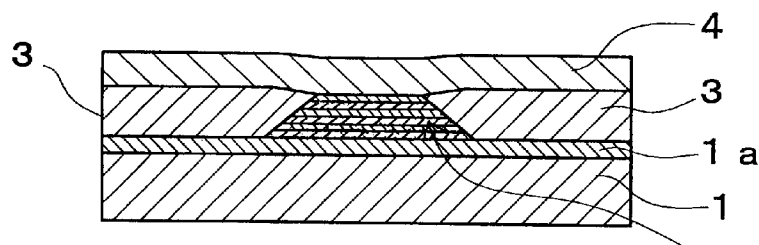
FIGS. 3A, 3B, 3C, 3D, and 3E are views showing part of the structure of a magnetic head in a process of forming a lead electrode pattern of the magnetic head according to a third embodiment of the present invention.

First, as shown in FIG. 3A, the lead electrodes 4 are formed on both the GMR 2 and the permanent magnetic domain control layer 3 formed so as to surround the GMR 2.

Figure 3B:
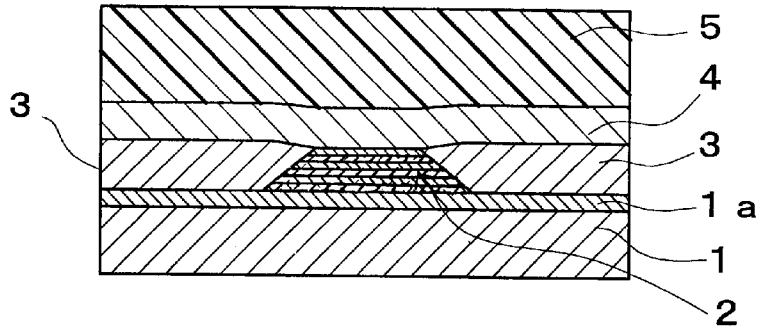

Then, as shown in FIG. 3B, the resist 5 is formed on the electrodes 4 by a spin coating process.

Figure 3C:
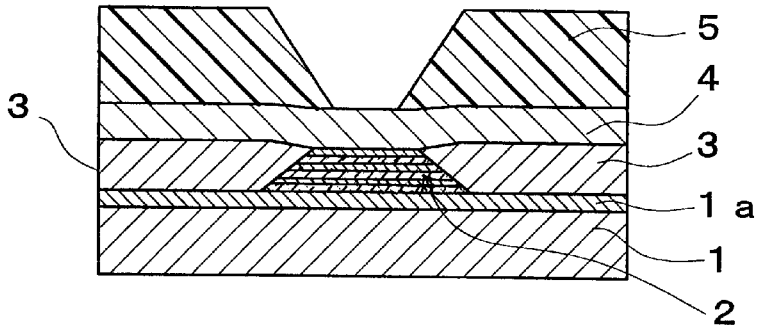

Then, as shown in FIG. 3C, the resist mask 5 is formed into a specified pattern by a photolithography process.

Figure 3D:
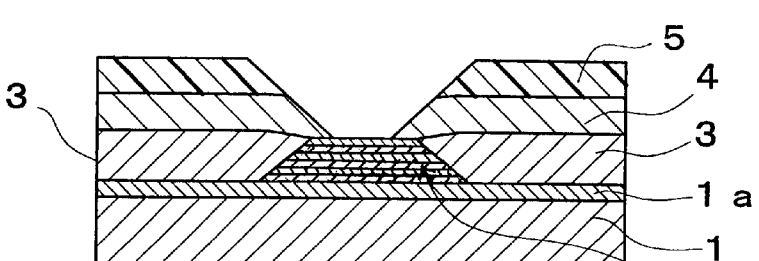

Then, as shown in FIG. 3D, the lead electrodes 4 are dry-etched on the basis of the resist mask 5.

This dry etching process is described in detail below.

First, a substrate (FIG. 3C) with the resist mask formed on the lead electrodes 4 is loaded into a vacuum reaction chamber of an inductively-coupled-plasma (ICP) dry etching system which is capable of generating high-density plasma and executing microfabrication.

Figure 3E:
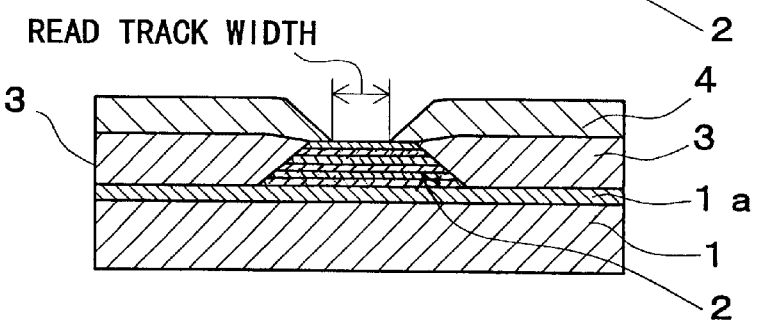

Next, $O_2$ gas is introduced into this reaction chamber at 100 cc/min., the pressure of the reaction chamber is adjusted to 1 Pa, and then RF powers of 800 W and 100 W are supplied to the ICP plasma source and the substrate stage having the substrate 20 placed thereon, respectively, so that oxygen plasma is generated, by which Ru, which is the lead electrodes 4, is dry-etched as shown in FIG. 3D. Ru forms $RuO_4$ in oxygen plasma, and this $RuO_4$ becomes gaseous, and is exhausted, in a vacuum because of its extremely low boiling point of 40° C. at atmospheric pressure, as compared with other metals, thus accelerating the etching process. Generally, a metallic oxide has a very high boiling point as much as 1000° C. or more at atmospheric pressure and therefore is hardly etched in oxygen plasma, whereas Ru, which is the lead electrodes 4, can be etched by $O_2$ plasma. Under this etching condition, the etching rate of Ru film as the lead electrodes 4 is 43 nm/min., and the etching rate of the resist is 0.8 $\mu$m/min (where Ru/resist selection ratio= 0.0538). Because the film thickness of the Ru film, which is the lead electrodes 4, is 100 nm, processing time necessary for execution of a 10% overetching can be calculated as 153 seconds from the above etching rate, during which the resist mask 5 decreases in film thickness from initial 3 $\mu$m to 1 $\mu$m. Besides, in this process, the Ta cap layer as the surface layer of the GMR 2 is not etched by oxygen plasma. However, Ta of the cap layer is liable to be oxidized and therefore it could be considered that TaOx is formed on the surface of the cap layer, whereas no effects on GMR characteristics were found according to an experiment. The structure after the etching is shown in FIG. 3E. The distance between the pair of lead electrodes 4 becomes the width of the regenerative track, and a width of 1 $\mu$m can be formed as an example.

As shown above, according to the third embodiment, since the lead electrodes 4 on the GMR 2 are formed of ruthenium (Ru), the lead electrodes 4 of ruthenium can be formed at a high selection ratio without excessively etching the surface-layer film of the GMR 2 in the process of forming a micro-pattern of the lead electrodes 4 by a dry etching method Thus, a magnetic head exhibiting good characteristics and quality can be obtained.

Fourth Embodiment

A magnetic head and a method for manufacturing the magnetic head as an example of a thin film device and the method for manufacturing the thin film device according to a fourth embodiment of the present invention are concretely described below with reference to FIGS. 4A, 4B, and 4C.

The fourth embodiment differs from the third embodiment in that the etching mask for the lead electrodes 4 is formed of a $SiO_2$ film 6 dry-etched with the resist mask 5, the rest of the constitution being the same as in the third embodiment.

Figure 4A:
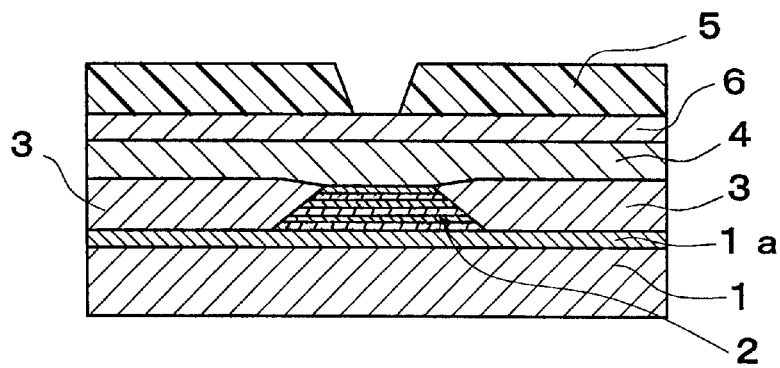
FIGS. 4A, 4B, and 4C are views showing part of the structure of a magnetic head in a process of forming a lead electrode pattern of a magnetic head according to a fourth embodiment of the present invention.
Figure 4B:
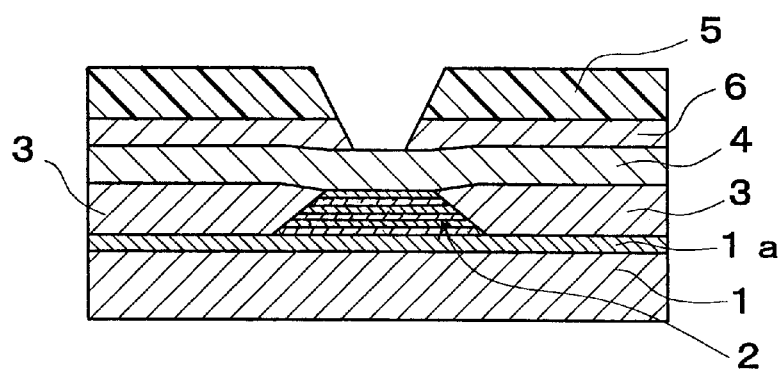
Figure 4C:
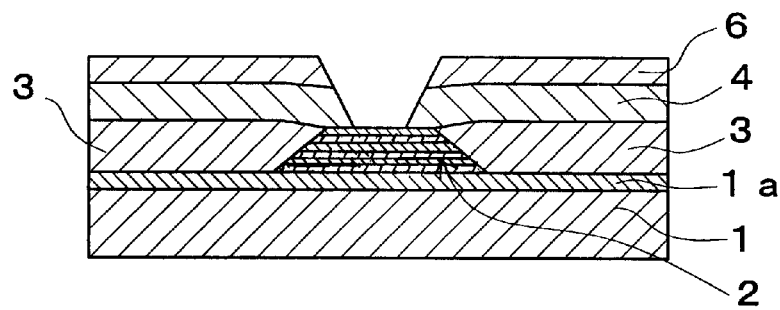

FIG. 4A shows part of the cross-sectional structure of the magnetic head after the formation of the resist mask 5. FIG. 4B shows a cross-sectional structure after the etching of the $SiO_2$ film 6. FIG. 4C shows a cross-sectional structure after the etching of the lead electrodes 4 of Ru.

The third embodiment has been so arranged that Ru of the lead electrodes 4 is etched with the resist mask 5 by oxygen plasma, where the resist is formed at a film thickness of, for example, 3 $\mu$m because of a low selection ratio of Ru to resist. However, when the recording density used in the magnetic head is 10–20 Gbit/in$^2$, the distance between the lead electrodes becomes as fine as about 0.5–0.3 $\mu$m, making it difficult to form this fine distance at the resist mask 5 having a film thickness of 3 $\mu$m. Thus, in the fourth embodiment, before the formation of the resist mask 5, a 100 nm thick $SiO_2$ film 6 is first formed on both the GMR 2 and the permanent magnetic domain control layer 3 formed so as to surround the GMR 2, as shown in FIG. 4A. Next, on the $SiO_2$ film 6, a pattern of the resist mask 5 is formed of microfabrication-compatible resist having a film thickness of about 1 $\mu$m (see FIG. 4A). Thereafter, with this resist mask 5 used as a mask for $SiO_2$ film etching, the $SiO_2$ film 6 having a film thickness of, for example, 100 nm is dry-etched by $CHF_3$ gas. Because the resist selection ratio for dry etching of the $SiO_2$ film 6 is not less than 1, the resist of the resist mask 5 is less subject to film decrease so that the $SiO_2$ film 6 can be formed as a mask for lead electrode etching, with fidelity to the resist mask 5. Also, the etching amount of the mask of the $SiO_2$ film 6 involved in the etching of Ru of the lead electrodes 4 by oxygen plasma is nearly zero, thus the mask of the $SiO_2$ film 6 being suitable as an etching mask.

The subsequent step which is an etching step using the $SiO_2$ film 6 as a mask for the lead electrode etching and which is an etching process of Ru of the lead electrodes 4 by oxygen plasma (see FIG. 4C) is the same as in the third embodiment. In this case, the resist mask 5 on the $SiO_2$ film 6 may be removed by ashing or a wet process prior to the etching, or may be continuously processed without being removed so that the productivity can be improved. In this case, the resist mask 5 is ashed by oxygen plasma during the etching Ru of the lead electrodes 4, thus dissipated.

In addition, although the $SiO_2$ film 6 used as the mask for lead electrode etching may be removed after the etching of Ru of the lead electrodes 4, the $SiO_2$ film 6 may also be left as it is and used as an interlayer insulating film without being removed, in which case the device reliability is improved.

As shown above, according to the fourth embodiment, since the lead electrodes 4 on the GMR 2 are formed of ruthenium (Ru), the lead electrodes 4 of ruthenium can be formed at a high selection ratio without excessively etching the surface layer film of the GMR 2 in the process of forming a micro-pattern of the lead electrodes 4 by a dry etching process. Thus, a magnetic head exhibiting good characteristics and quality can be obtained.

Further, when the recording density used in the magnetic head is 10–20 Gbit/in$_2$, the distance between the lead electrodes becomes as fine as about 0.5–0.3 $\mu$m, making it difficult to form this fine distance at the resist mask 5 having a film thickness of 3 $\mu$m used in the third embodiment. However, in the fourth embodiment, before the formation of the resist mask 5, a 100 nm thick $SiO_2$ film 6 is formed on both the GMR 2 and the permanent magnetic domain control layer 3 formed so as to surround the GMR 2. The resist mask 5 is further formed on this $SiO_2$ film 6, the. $SiO_2$ film 6 is etched with the resist mask 5 to form a pattern on the $SiO_2$ film 6, and with the patterned $SiO_2$ film 6 used as a mask, a fine pattern can be formed in the lead electrodes 4. Thus, according to the fourth embodiment, a fine pattern with a lead electrode distance of, for example, about 0.5–0.3 $\mu$m can be formed with reliability and good precision.

Fifth Embodiment

A magnetic head and a method for manufacturing the magnetic head as an example of a thin film device and the method for manufacturing the thin film device according to a fifth embodiment of the present invention are concretely described below with reference to FIGS. 5A, 5B, 5C, and 5D.

The fifth embodiment differs from the third embodiment in that the lead electrodes electrically connected to the read-use magnetoresistive element of the magnetic head is made of two or more conductive layers, where a lead-electrode lower layer portion 7 as an electrically conductive layer on the lower-layer side in contact with the magnetoresistive element is made of ruthenium (Ru) having a film thickness of 10 nm, while an electrically conductive layer 4a on the upper-layer side is made of Ta having a film thickness of a 100 nm, and where the resist mask 5 is 1 μm thick and microfabrication-compatible with an opening 5a formed with a size of 0.5 μm. The rest of the constitution is the same as in the third embodiment.

Figure 5A:
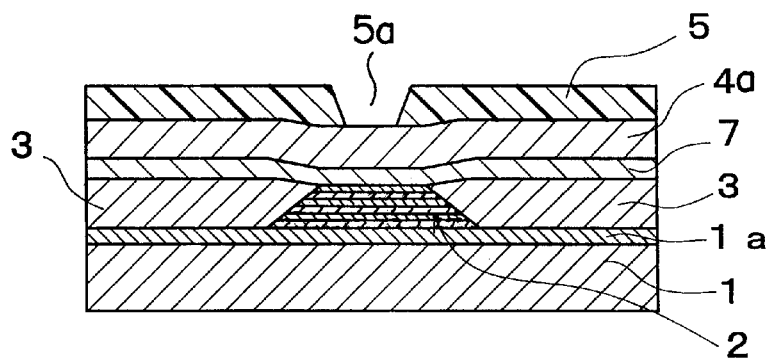
FIGS. 5A, 5B, 5C, and 5D are views showing part of the structure of a magnetic head in a process of forming a lead electrode pattern of a magnetic head according to a fifth embodiment of the present invention.
Figure 5B:
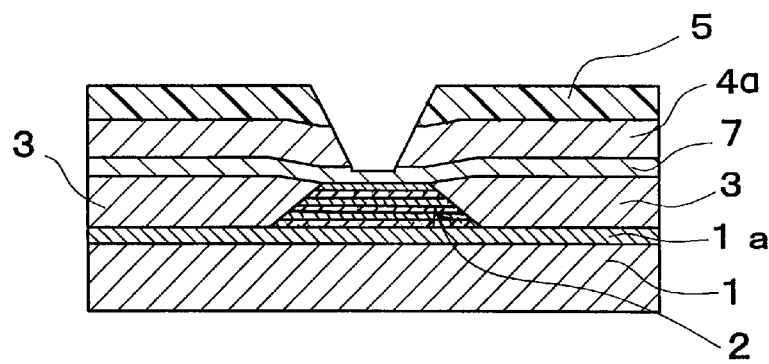
Figure 5C:
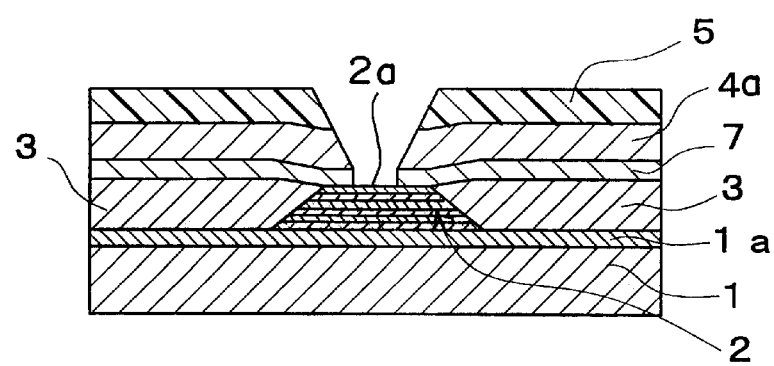
Figure 5D:
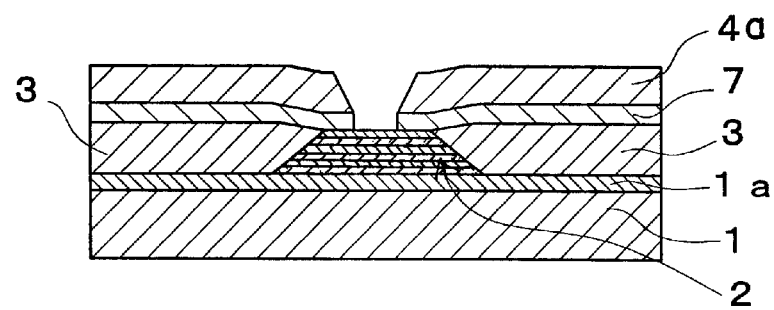

With respect to the magnetic head and the method for manufacturing the magnetic head constituted as described above, the manufacturing method is described with reference to FIGS. 5A, 5B, 5C, and 5D. The fifth embodiment is characterized in that the two or more conductive layers constituting the lead electrodes, i.e. Ta of the upper layer-side conductive layer 4a and Ru of the lead-electrode lower layer portion 7 as the lower layer-side conductive layer, are dry-etched in two steps. FIG. 5A shows part of a cross-sectional structure of the magnetic head before the etching of Ta of the upper layer-side conductive layer 4a of the lead electrodes. FIG. 5B shows part of the cross-sectional structure of the magnetic head after the etching of Ta of the upper layer-side conductive layer 4a of the lead electrodes. FIG. 5C shows a cross-sectional structure of the magnetic head after the etching of Ru of the lead-electrode lower layer portion 7 as the lower layer-side conductive layer of the lead electrodes. FIG. 5D shows a cross-sectional structure of the magnetic head in a state that the resist mask 5 has been removed.

First, a substrate (FIG. 5A) with the resist mask 5 formed on the lead electrodes 4a is loaded into a vacuum reaction chamber of an inductively-coupled-plasma (ICP) dry etching system.

Next, as a first-step etching, $SF_6$, gas is introduced into this reaction chamber at 50 cc/min., the pressure of the reaction chamber is adjusted to 0.5 Pa, and then RF powers of 300 W and 30 W are supplied to the ICP plasma source and the substrate stage having the substrate 20 placed thereon, respectively, so that $SF_6$ plasma is generated, by which Ta of the upper-layer lead electrode 4a is dry-etched as shown in FIG. 5B. In this process, the etching rate of Ta of the upper-layer lead electrode 4a and the selection ratio of the resist mask 5 and the ground lead-electrode lower layer portion 7 to Ru are 120 nm/min., 0.6 and 82, respectively, so that enough residual film (0.8 μm residual film for 20% overetching) exists in the resist, thus allowing Ta of the upper-layer lead electrode 4a to be etched without substantially cutting the ground lead-electrode lower layer portion 7.

Next, as a second-step etching, $O_2$ gas is introduced into this reaction chamber at 100 cc/min., the pressure of the reaction chamber is adjusted to 1 Pa, and then RF powers of 800 W and 100 W are supplied to the ICP plasma source and the substrate stage, respectively, so that oxygen plasma is generated, by which Ru of the lead-electrode lower layer portion 7 is etched. In this process, the etching rate of Ru film of the lead-electrode lower layer portion 7 is 43 nm/min., and the etching rate of resist is 0.8 μm/min. (Ru/resist selection ratio=0.0538). Therefore, the etching time of the 10 nm Ru film of the lead-electrode lower layer portion 7 is 18 seconds with a 20% overetching. Also in this process, Ta as the cap layer 2a at the surface layer of the GMR 2 is not etched by oxygen plasma.

As shown above, according to the fifth embodiment, the lead electrode electrically connected to the read-use magnetoresistive element of the magnetic head is made up of two or more conductive layers, where the lead-electrode lower layer portion 7 as an electrically conductive layer on the lower-layer side in contact with the magnetoresistive element is made of ruthenium (Ru), while the electrically conductive layer 4a on the upper-layer side is made of Ta. Therefore, in the process of forming a micro-pattern of the lead electrodes by a dry etching process, the micro fabrication-compatible resist mask 5 is usable, and ruthenium (Ru) of the lead-electrode lower layer portion 7 can be formed at a high selection ratio without excessively etching the cap layer 2a, which is the surface layer film of the GMR 2. Thus, a magnetic head exhibiting good characteristics and quality can be obtained.

Sixth Embodiment

A magnetic head and a method for manufacturing the magnetic head as an example of a thin film device and the method for manufacturing the thin film device according to a sixth embodiment of the present invention are concretely described below with reference to FIGS. 6A, 6B, 6C, 6D, and 6E.

The sixth embodiment differs from the fifth embodiment in that between a magnetoresistive element 2 of the magnetic head and a 100 nm thick Ta lead electrode 4b to be electrically connected to the magnetoresistive element 2, a 10 nm thick film of Ru is disposed as a contact layer 8 on the magnetoresistive element 2 and only between the magnetoresistive element 2 and the lead electrode 4b. The rest of the constitution is the same as in the fifth embodiment.

Figure 6A:
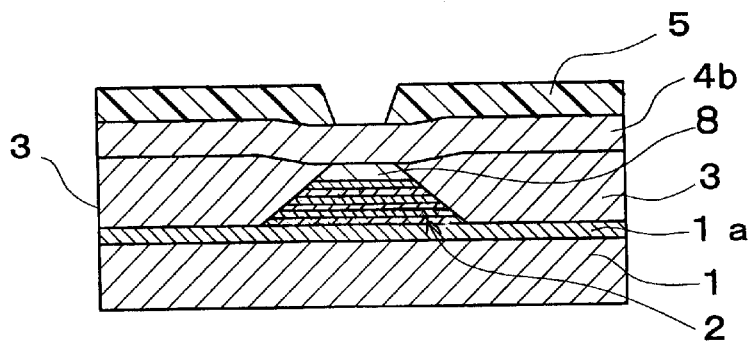
FIGS. 6A, 6B, 6C, 6D, and 6E are views showing part of the structure of a magnetic head in a process of forming a lead electrode pattern of a magnetic head according to a sixth embodiment of the present invention.
Figure 6B:
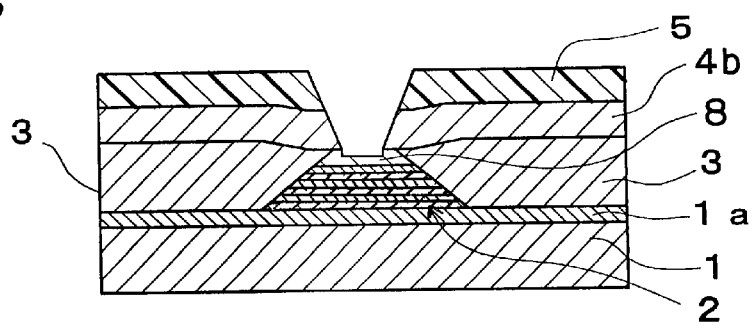
Figure 6C:
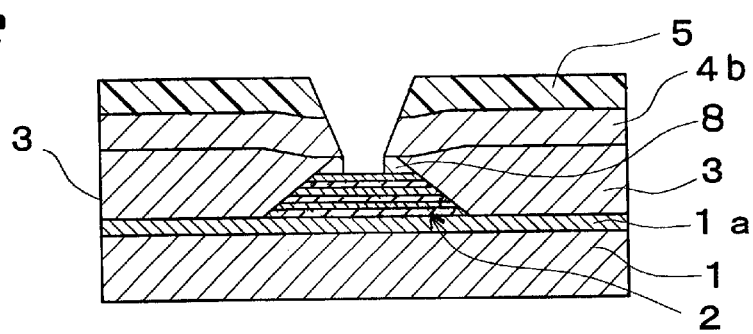
Figure 6D:
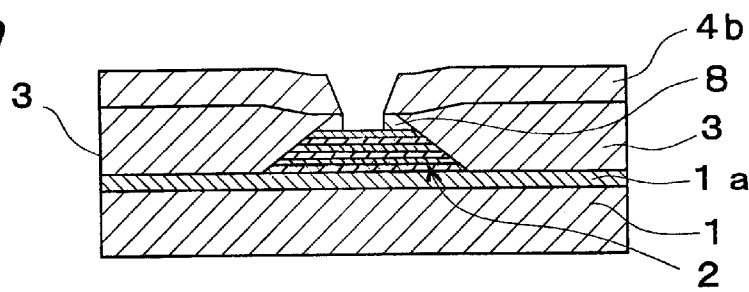
Figure 6E:
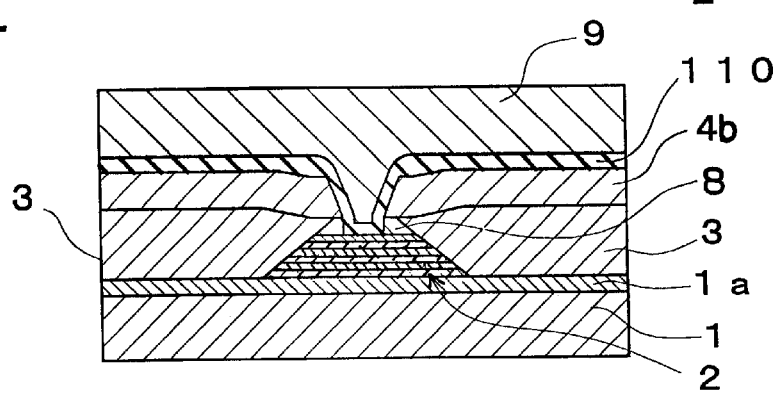
Figure 7:
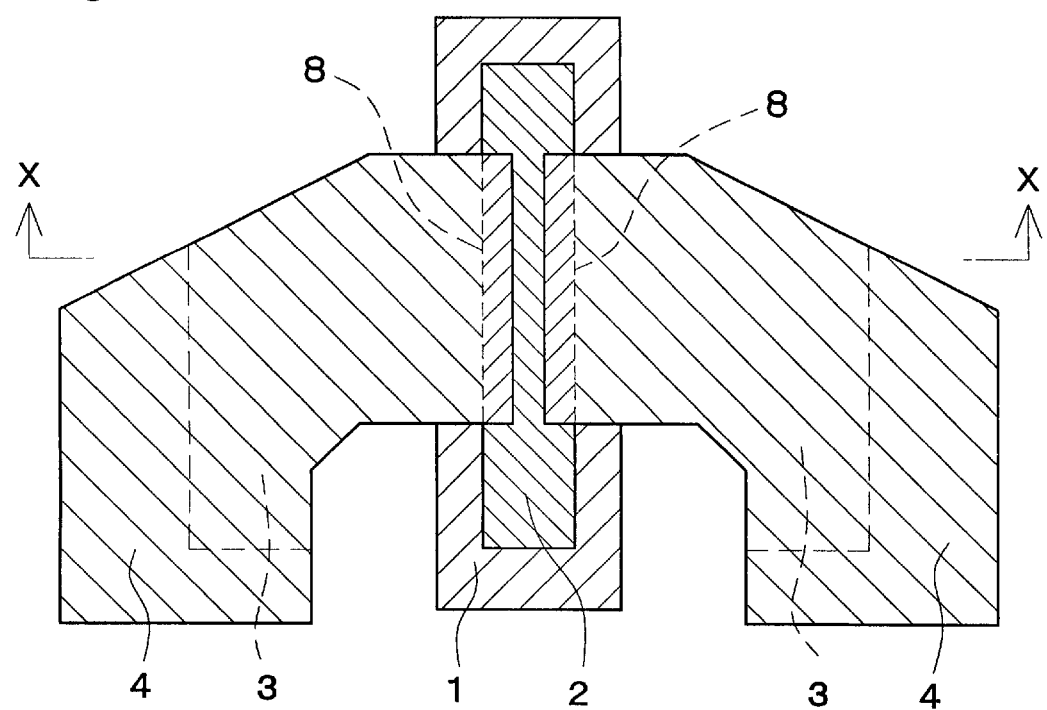
FIG. 7 is a cross-sectional plan view of the magnetic head according to the sixth embodiment, where a view cut out along the line X—X of this figure is FIG. 6.

With respect to the magnetic head and the method for manufacturing the magnetic head constituted as described above, the manufacturing method is described with reference to FIGS. 6A, 6B, 6C, 6D, and 6E. The sixth embodiment is characterized in that a contact layer 8 of Ru is previously deposited on the GMR 2 and patterned simultaneously with the GMR 2. Thereafter patterning of the permanent magnetic domain control layer 3 and deposition of the lead electrodes 4b are performed, and further thereafter Ta, which is the lead electrodes 4b, and Ru, which is the contact layer 8, are etched continuously in two steps. FIG. 6A shows part of a cross-sectional structure of the magnetic head before the etching of Ta of the lead electrodes 4b, FIG. 6B shows part of a cross-sectional structure of the magnetic head after the etching of Ta of the lead electrodes 4b, and FIG. 6C shows a cross-sectional structure after the etching of a 10 nm thick film of Ru as the contact layer 8 disposed between the magnetoresistive element 2 and the lead electrodes 4. FIG. 6D shows a cross-sectional structure of the magnetic head in a state that the resist mask 5 has been removed. FIG. 6E shows a cross-sectional structure of the magnetic head in a state that a 30 nm layer of alumina, which is an upper gap layer as an insulating film 110, and a NiFe film 9 as an upper shield layer have been formed.

The magnetic head and the method for manufacturing the magnetic head constituted as described above are the same as in the fifth embodiment.

As shown above, according to the sixth embodiment, between the magnetoresistive element 2 of the magnetic head and the lead electrode 4b of Ta to be electrically connected to the magnetoresistive element 2, Ru is disposed as the contact layer 8 on the magnetoresistive element 2 and only between the magnetoresistive element 2 and the lead electrodes 4b. Therefore, in the process of forming a micro-pattern of the lead electrodes 4b by a dry etching process, the microfabrication-compatible resist mask 5 is usable, and the lead electrodes 4b can be formed at a high selection ratio without excessively etching the surface layer film of the GMR 2. Thus, a magnetic head exhibiting good characteristics and quality can be obtained.

In addition, in the third to sixth embodiments, Ru is used as lead electrodes, a lower-layer material for two-layer lead electrodes, and a contact layer on the GMR. However, since $RuO_2$ can be etched by oxygen plasma, $RuO_2$ may also be used instead of Ru, where similar effects can be obtained.

In the embodiments, Ta is used as a cap layer, which is an upper-layer of the GMR. However, without being limited to this, the present invention may use various metals and insulating materials such as Cr, PtMn, and NiFe, where similar effects can be obtained. Furthermore, even with such a magnetoresistive element having no cap,.layer, the magnetoresistive element can be formed without etching the surface layer thereof, where similar effects can be obtained.

Also, in the third to sixth embodiments, the spin-valve type GMR is used as the magnetoresistive element 2. However, dual-type GMRs, synthetic type GMRs, tunnel-type MR elements, or the like may also be used, where similar effects can be obtained.

Also, in the fifth and sixth embodiments, Ta is used as the material ofthe conductive layer 4a on the upper-layer side of the lead electrode as well as the lead electrodes 4b. However, non-magnetic metals such as W, Ta, Rh, Cr, Al, and Ir, or alloys containing any of these elements may be used instead.

Also, the fifth and sixth embodiments, $SF_6$ is used as the dry etching gas for Ta of the conductive layer 4a on the upper-layer side of the lead electrodes as well as the lead electrodes 4b. However, such gases as $CF_4$, $CHF_3$, $Cl_2$, and HBr containing halogen elements may also be used. The gas may be selected depending on the selection ratio of mask to ground material.

It is noted here that, in the first to sixth embodiments, using Ru or $RuO_2$ as the material ofthe conductor layer or lead electrodes or lead-electrode lower layer portion or the like herein means not only that using generally 100% of Ru or $RuO_2$, but also that Ru or $RuO_2$ content can substantially be regarded as generally 100% even if other materials are contained, for example.

Furthermore, as shown in the drawings, the opening is formed so as to be tapered in the final stage of the lead electrode pattern forming process such as shown in FIG. 3E, FIG. 4C, FIG. 5D, FIG. 6D, and the like in the third to sixth embodiments. This is intended to form a 300 Å alumina insulating film on the exposed surface of the lead electrodes as an interlayer insulating film, as indicated at 110 in FIG. 6E, so that an insulating function can be securely fulfilled.

In addition, the foregoing various embodiments may be combined in various ways as required, where their respective effects can be exerted together.

EFFECT OF INVENTION

As described above, according to the present invention, in the process of forming a micro-pattern of a conductor layer serving as an electrical wiring by performing a dry etching technique, a conductor layer that can be etched by oxygen-containing gas (e.g., Ru or $RuO_2$) is formed as the conductor layer, and the conductor layer is etched by the oxygen-containing gas. As a result, a highly selective dry etching can be accomplished without excessively etching the ground layer under the conductor layer. Thus, a thin film device exhibiting good characteristics, quality, and yield can be obtained. That is, in the process of forming a conductor layer pattern serving as an electrical wiring to be formed on a substrate, a film of the conductor layer which is etchable by an oxygen-containing gas is deposited as the conductor layer, an etching mask pattern is formed on the conductor layer, and thereafter a dry etching is performed at the conductor layer with plasma of a gas containing at least oxygen, by which the patterning ofthe conductor layer is accomplished. By doing this, the conductor layer pattern serving as an electrical wiring can be formed highly selectively to the ground layer thereunder, so that a thin film device exhibiting good characteristics and manufacturing yield can be obtained.

In one case of the present invention, the conductor layer serving as an electrical wiring in the thin film device is formed of two or more conductor layers, and a conductor layer that is the lowermost layer of the conductor layers is a conductor layer that can be dry-etched by an oxygen-containing gas. In this case, the conductor layer pattern serving as an electrical wiring can be formed at a high selection ratio to the ground layer thereunder.

In one case of the present invention, the conductor layer that can be dry-etched by the oxygen-containing gas is made of Ru or $RuO_2$. In this case, the conductor layer pattern serving as an electrical wiring can be formed at a high selection ratio to the ground layer.

In one case of the present invention, an upper layer of the two or more conductor layers contains any one of polysilicon, W, Cu, Al, Ag, and Au. In this case, the conductor layer pattern serving as an electrical wiring can be formed at a high selection ratio to the ground layer thereunder.

In one case of the present invention, in the process of forming a pattern in the conductor layer serving as an electrical wiring to be formed on a substrate, a film of the conductor layer which is etchable by an oxygen-containing gas is deposited as the conductor layer, an etching mask pattern is formed on the conductor layer, and thereafter a dry etching is performed at the conductor layer with plasma of a gas containing at least oxygen, by which the patterning of the conductor layer is accomplished. In this case, the conductor layer pattern can be formed highly selectively to the ground layer thereunder.

In one case of the present invention, in the process of forming a pattern in the conductor layer serving as an electrical wiring to be formed on a substrate, films of a lower conductor layer which is etchable by an oxygen-containing gas and one or more upper conductor layers are deposited as the conductor layers, an etching mask pattern is formed on the upper conductor layer, and thereafter, dry etching of the upper and lower conductor layers is performed with plasma of a gas containing at least oxygen, by which the patterning of the upper and lower conductor layers is accomplished. In this case, the conductor layer pattern serving as an electrical wiring can be formed at a high selection ratio to the ground layer thereunder.

In one case of the present invention, the conductor layer that is etchable by the oxygen-containing gas is made of Ru or $RuO_2$. In this case, the conductor layer pattern serving as an electrical wiring can be formed at a high selection ratio to the ground layer thereunder.

In one case of the present invention, the upper layer of the two or more conductor layers contains any one of polysilicon, W, Cu, Al, Ag, and Au. In this case, the conductor layer pattern serving as an electrical wiring can be formed at a high selection ratio to the ground layer thereunder.

In one case of the present invention, the dry etching of the upper conductor layer is performed with plasma of a halogen-containing gas. In this case, the conductor layer pattern serving as an electrical wiring can be formed at a high selection ratio to the ground layer thereunder.

In one case of the present invention, the thin film device is a semiconductor device or a TFT for liquid crystal displays. In this case, the conductor layer pattern serving as an electrical wiring can be formed at a high selection ratio to the ground layer thereunder, thus allowing the thin film device to be manufactured with high quality and high yield.

Also, according to one aspect of the present invention, in the process of forming a micro-pattern of the lead electrodes by a dry etching process, the lead electrode pattern can be formed without excessively etching the surface layer of the GMR. Thus, a magnetic head exhibiting good characteristics and quality can be obtained.

That is, in the magnetic head and the method for manufacturing the magnetic head according to one aspect of the present invention, Ru or $RuO_2$ is used as an electrically conductive layer connected to the magnetoresistive element of the magnetic head, and a dry etching process of the Ru or $RuO_2$ and the magnetoresistive element, which is the ground layer thereunder, are performed with plasma of a oxygen-containing gas. Therefore, according to this present invention, in the process of forming on the GMR a micro-pattern of a pair of lead electrodes, provided to sense variations in resistance of the GMR due to external magnetic fields, by a dry etching process, the lead electrode pattern can be formed without excessively etching the surface layer of the magnetoresistive element. Thus, a magnetic head exhibiting good characteristics and quality can be obtained.

In one case of the present invention, Ru or $RuO_2$ is used as an electrically conductive layer to be electrically connected to the magnetoresistive element ofthe magnetic head. In this case, in the process of forming the micro-pattern of the lead electrodes by a dry etching process, the lead electrode pattern can be formed without excessively etching the surface layer of the GMR.

In one case of the present invention, the material of one pair of lead electrodes electrically connected to the magentoresistive element of the magnetic head is Ru or $RuO_2$. In this case, in the process of forming the micro-pattern of the lead electrodes by performing a dry etching process, the lead electrode pattern can be formed without excessively etching the surface layer of the GMR.

In one case ofthe present invention, each of one pair of lead electrodes electrically connected to the magnetoresistive element of the magnetic head is comprised of two or more electrically conductive layers, and the electrically conductive material in contact with the magnetoresistive element is Ru or $RuO_2$. In this case, in the process of forming the micro-pattern of the lead electrodes by performing a dry etching process, the lead electrode pattern can be formed without excessively etching the surface layer of the GMR.

In one case the present invention, Ru or $RuO_2$ as a contact layer is sandwiched between the magnetoresistive element of the magnetic head and a pair ofthe lead electrodes electrically connected to the magnetoresistive element. In this case, in the process of forming the micro-pattern of the lead electrodes by performing a dry etching process, the lead electrode pattern can be formed without excessively etching the surface layer of the GMR.

In one case of the present invention, a magnetic head comprises: an insulating ground layer; a lower shield magnetic layer formed on the insulating ground layer; a magnetoresistive element selectively formed on a first insulating layer (e.g., lower gap film) formed on the lower shield magnetic layer; a permanent magnetic domain control layer formed with the magnetoresistive element interposed therein in order to give a magnetic bias to the magnetoresistive element layer; a pair of lead electrodes formed with a specified spacing from each other and provided to sense variations in electrical resistance of the magnetoresistive element due to external magnetic fields; a second insulating layer (e.g., upper gap film) formed so as to cover the magnetoresistive element, the permanent magnetic domain control layer, and the pair of lead electrodes; and an upper shield magnetic layer formed on the second insulating layer, wherein Ru or $RuO_2$ is used as the pair of lead electrodes connected to the magnetoresistive element, or as a contact layer of the lead electrodes. In this case, in the process of forming the micro-pattern of the lead electrodes by performing a dry etching process, the lead electrode pattern can be formed without excessively etching the surface layer of the GMR.

In one case of the present invention, in a process for patterning a pair of lead electrodes on a magnetoresistive element portion and on a permanent magnetic domain control layer formed at both end portion's of the magnetoresistive element in a direction of track width on a lower shield layer and a gap film both formed on a substrate, with the lead electrodes to be electrically connected in series to the magnetoresistive element, the process of patterning the lead electrodes comprises: depositing a film of Ru serving as the material of the lead electrodes; forming an etching mask pattern; and thereafter performing a dry etching process of Ru with plasma of a gas containing at least oxygen. In this case, in the process of forming a micropattern of Ru serving as the lead electrodes by performing a dry etching process, the pattern can be formed without excessively etching the surface layer of the GMR.

In one case of the present invention, in a process for patterning a pair of lead electrodes on a magnetoresistive element portion and on a permanent magnetic domain control layer formed at both end portions ofthe magnetoresistive element in a direction of track width on a lower shield layer and a gap film both formed on a substrate, with the lead electrodes to be electrically connected in series to the magnetoresistive element, the process of patterning the lead electrodes comprises: depositing a film of $RuO_2$ serving as the material of the lead electrodes; forming an etching mask pattern; and thereafter performing a dry etching process of $RuO_2$ with plasma of a gas containing at least oxygen. In this case, in the process of forming a micro-pattern of $RuO_2$ serving as the lead electrodes by performing a dry etching process, the pattern can be formed without excessively etching the surface layer of the GMR.

In one case of the present invention, the method further comprises: forming the etching mask pattern according to the present invention by depositing a film of $SiO_2$ or SiN; thereafter forming a resist pattern by photolithography; and thereafter forming the $SiO_2$ film or SiN film by dry etching, where the dry etching of Ru or $RuO_2$ is performed with plasma of a gas containing at least oxygen. In this case, enough high selection ratio can be taken for the mask of the SiO$_2$ film or SiN film, and also the micro-pattern of RuO$_2$ serving as the lead electrodes can be formed without excessively etching the surface layer of the GMR.

In one case of the present invention, the SiO$_2$ film or SiN film that has been used as the etching mask is used as part of an insulating film on the lead electrodes.

In one case of the present invention, in a process for patterning a pair of lead electrodes on a magnetoresistive element portion and on a permanent magnetic domain control layer formed at both end portions ofthe magnetoresistive element in a direction of track width on a lower shield layer and a gap film both formed on a substrate, with the lead electrodes to be electrically connected in series to the magnetoresistive element, the process of patterning the lead electrodes comprises: forming the lead electrodes from two or more conductor layers, a material of the conductor layers in contact with the magnetoresistive element being Ru; forming an etching mask pattern; thereafter performing a dry etching process of the lead electrode layer other than the Ru layer with plasma of a gas containing halogen; and thereafter performing a dry etching process of the Ru layer with plasma of a gas containing at least oxygen. In this case, in the process of forming a micro-pattern of the lead electrodes by performing a dry etching process,. the lead electrode pattern can be formed without excessively etching the surface layer of the GMR.

In one case of the present invention, in a process for patterning a pair of lead electrodes on a magnetoresistive element portion and on a permanent magnetic domain control layer formed at both end portions of the magnetoresistive element in a direction of track width on a lower shield layer and a gap film both formed on a substrate, with the lead electrodes to be electrically connected in series to the magnetoresistive element, the process of patterning the lead electrodes comprises: forming the lead electrodes from two or more conductor layers, a material of the conductor layers in contact with the magnetoresistive element being RuO$_2$; forming an etching mask pattern; thereafter performing a dry etching process of the lead electrode layer other than the RuO$_2$ layer with plasma of a gas containing halogen; and thereafter performing a dry etching process of the RuO$_2$ layer with plasma of a gas containing at least oxygen. In this case, in the process of forming a micro-pattern of the lead electrodes by performing a dry etching process, the lead electrode pattern can be formed without excessively etching the surface layer of the GMR.

In one case of the present invention, in a process for patterning a pair of lead electrodes on a magnetoresistive element portion and on a permanent magnetic domain control layer formed at both end portions of the magnetoresistive element in a direction of track width on a lower shield layer and a gap film both formed on a substrate, with the lead electrodes to be electrically connected in series to the magnetoresistive element, the process of patterning the lead electrodes comprises: forming a Ru layer on one side of the read-use magnetoresistive element to be closer to the lead electrodes; performing a patterning of the magnetoresistive element and a patterning of the permanent magnetic domain control layer on both end portions of the magnetoresistive element in the track width direction; thereafter depositing a film of the lead electrodes and forming an etching mask by photolithography; thereafter performing a dry etching process of the lead electrodes with plasma of a halogen-containing gas; and thereafter performing a dry etching process ofthe Ru layer with plasma of a gas containing at least oxygen. In this case, in the process of forming a micro-pattern ofthe lead electrodes by performing a dry etching process, the lead electrode pattern can be formed without excessively etching the surface layer of the GMR.

In one case of the present invention, in a process for patterning a pair of lead electrodes on a magnetoresistive element portion and on a permanent magnetic domain control layer formed at both end portions of the magnetoresistive element in a direction of a track width on a lower shield layer formed on a substrate, with the lead electrodes to be electrically connected in series to the magnetoresistive element, the process of patterning the lead electrodes comprises: forming a RuO$_2$ layer on one side of the read-use magnetoresistive element to be closer to the lead electrodes; performing a patterning ofthe magnetoresistive element and a patterning of the permanent magnetic domain control layer on both end portions of the magnetoresistive element in the track width direction; thereafter depositing a film of the lead electrodes and forming an etching mask by photolithography; thereafter performing a dry etching process of the lead electrodes with plasma of a halogen-containing gas; and thereafter performing a dry etching process of the RuO$_2$ layer with plasma of a gas containing at least oxygen. In this case, in the process of forming a micro-pattern of the lead electrodes by performing a dry etching process, the lead electrode pattern can be formed without excessively etching the surface layer of the GMR.

In one case of the present invention, in the magnetic head the material of the lead electrodes other than Ru or RuO$_2$ is a nonmagnetic metal such as W, Ta, Rh, Cr, Al, and Ir, or an alloy containing any of these elements. In this case, in the process of forming a micro-pattern of the lead electrodes by performing a dry etching process, the lead electrode pattern can be formed without excessively etching the surface layer of the GMR.

In one case of the present invention, in the method for manufacturing the magnetic head the material of the lead electrodes other than Ru or RuO$_2$ is a non-magnetic metal such as W, Ta, Rh, Cr, Al, and Ir, or an alloy containing any of these elements. In this case, in the process of forming a micro-pattern of the lead electrodes by performing a dry etching process, the lead electrode pattern can be formed without excessively etching the surface layer of the GMR.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for manufacturing a thin film device including patterning a pair of lead electrodes on a magnetoresistive element portion and on a permanent magnetic domain control layer at both end portions of a magnetoresistive element, of the magnetoresistive element portion, in a direction of track width on a lower shield layer and a first gap film both formed on a substrate, with the pair of lead electrodes to be electrically connected in series to the magnetoresistive element, wherein patterning the pair of lead electrodes comprises:

depositing a film of Ru or RuO$_2$, which film is to serve as the pair of lead electrodes;

forming an etching mask pattern on said film of Ru or RuO$_2$; and then performing dry etching of said film of Ru or RuO$_2$ with plasma of a gas containing at least oxygen.

2. The method for manufacturing a thin film device according to claim 1, wherein forming the etching mask pattern on said film of Ru or $RuO_2$ includes:

depositing a film of $SiO_2$ or SiN on said film of Ru or $RuO_2$; then forming a resist pattern on said film of $SiO_2$ or SiN by photolithography; and then dry etching said film of $SiO_2$ or SiN.

3. The method for manufacturing a thin film device according to claim 2, wherein said film of $SiO_2$ or SiN is used as part of an insulating film on the pair of lead electrodes.

4. A method for manufacturing a thin film device including patterning a pair of lead electrodes on a magnetoresistive element portion and on a permanent magnetic domain control layer at both end portions of a magnetoresistive element, of the magnetoresistive element portion, in a direction of track width on a lower shield layer and a first gap film both formed on a substrate, with the pair of lead electrodes to be electrically connected in series to the magnetoresistive element, wherein patterning the pair of lead electrodes comprises:

depositing at least two conductor layers on the magnetoresistive element portion, with one of the at least two conductor layers being in contact with the magnetoresistive element and being an Ru or $RuO_2$ layer, wherein said at least two conductor layers are to serve as the pair of lead electrodes;

forming an etching mask pattern on said at least two conductor layers; then dry etching another of said at least two conductor layers, that is separated from the magnetoresistive element portion by the Ru or $RuO_2$ layer, with plasma of a gas containing halogen; and then dry etching the Ru or $RuO_2$ layer with plasma of a gas containing at least oxygen.

5. The method according to claim 4, wherein said another of said at least two conductor layers comprises a layer of any of W, Ta, Rh, Cr, Al and Ir, or a layer of an alloy containing any of W, Ta, Rh, Cr, Al and Ir.

6. A method for manufacturing a thin film device including patterning a pair of lead electrodes on a magnetoresistive element portion and on a permanent magnetic domain control layer at both end portions of a magnetoresistive element, of the magnetoresistive element portion, in a direction of track width on a lower shield layer and a first gap film both formed on a substrate, with the pair of lead electrodes to be electrically connected in series to the magnetoresistive element, wherein patterning the pair of lead electrodes comprises:

forming an Ru layer on one side of the magnetoresistive element that is to be closer to the pair of lead electrodes;

patterning the magnetoresistive element, and patterning the permanent magnetic domain control layer at both end portions of the magnetoresistive element in the track width direction; then depositing a film that is to serve as the pair of lead electrodes, and forming an etching mask on said film by photolithography; then dry etching said film with plasma of a halogen-containing gas; and then dry etching said Ru layer with plasma of a gas containing at least oxygen.

7. A method for manufacturing a thin film device including patterning a pair of lead electrodes on a magnetoresistive element portion and on a permanent magnetic domain control layer at both end portions of a magnetoresistive element, of the magnetoresistive element portion, in a direction of track width on a lower shield layer formed on a substrate, with the pair of lead electrodes to be electrically connected in series to the magnetoresistive element, wherein patterning the pair of lead electrodes comprises:

forming an $RuO_2$ layer on one side of the magnetoresistive element that is to be closer to the pair of lead electrodes;

patterning the magnetoresistive element, and patterning the permanent magnetic domain control layer at both end portions of the magnetoresistive element in the track width direction; then depositing a film that is to serve as the pair of lead electrodes, and forming an etching mask on said film by photolithography; then dry etching said film with plasma of a halogen-containing gas; and then dry etching said $RuO_2$ layer with plasma of a gas containing at least oxygen.

* * * * *